United States Patent
Basceri et al.

(10) Patent No.: US 6,982,103 B2
(45) Date of Patent: Jan. 3, 2006

(54) CHEMICAL VAPOR DEPOSITION METHODS OF FORMING BARIUM STRONTIUM TITANATE COMPRISING DIELECTRIC LAYERS, INCLUDING SUCH LAYERS HAVING A VARIED CONCENTRATION OF BARIUM AND STRONTIUM WITHIN THE LAYER

(75) Inventors: Cem Basceri, Boise, ID (US); Nancy Alzola, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 62 days.

(21) Appl. No.: 10/769,149

(22) Filed: Jan. 30, 2004

(65) Prior Publication Data

US 2004/0185177 A1 Sep. 23, 2004

Related U.S. Application Data

(63) Continuation of application No. 09/905,320, filed on Jul. 13, 2001.

(51) Int. Cl.
*C23C 16/00* (2006.01)
*C23C 16/06* (2006.01)
(52) U.S. Cl. .................. 427/255.36; 427/255.32; 427/255.28
(58) Field of Classification Search .......... 427/255.15, 427/255.19, 126.3, 255.23, 255.31, 255.32, 427/255.36, 255.7; 438/3, 785
See application file for complete search history.

(56) References Cited

U.S. PATENT DOCUMENTS

| | | | |
|---|---|---|---|
| 4,105,810 A | 8/1978 | Yamazaki et al. | |
| 4,261,698 A | 4/1981 | Carr et al. | |
| 4,691,662 A | 9/1987 | Roppel et al. | |
| 5,006,363 A | 4/1991 | Fujii et al. | |
| 5,164,363 A | 11/1992 | Eguchi et al. | |
| 5,183,510 A | 2/1993 | Kimura | |
| 5,254,505 A | 10/1993 | Kamiyama | |
| 5,256,455 A | 10/1993 | Numasawa | |

(Continued)

FOREIGN PATENT DOCUMENTS

EP 0 030 798 A1 6/1981

(Continued)

OTHER PUBLICATIONS

Stemmer et al., *Accommodation of nonstoichiometry in (100) fiber-textured $(Ba_xSr_{1-x})\,Tl_{4+y}O_{3+2}$ thin films grown by chemical vapor deposition*, 74 Appl. Phys. Lett., No. 17, pp. 2432-2434 (Apr. 26, 1999).

(Continued)

*Primary Examiner*—Timothy Meeks
*Assistant Examiner*—Eric B. Fuller
(74) *Attorney, Agent, or Firm*—Wells St. John P.S.

(57) ABSTRACT

The invention a chemical vapor deposition method of forming a barium strontium titanate comprising dielectric layer having a varied concentration of barium and strontium, and/or titanium, within the layer. A substrate is positioned within a chemical vapor deposition reactor. Barium and strontium are provided within the reactor by flowing at least one metal organic precursor to the reactor. Titanium is provided within the reactor. One or more oxidizers are flowed to the reactor. In one aspect, conditions are provided within the reactor to be effective to deposit a barium strontium titanate comprising dielectric layer on the substrate from the reactants.

29 Claims, 2 Drawing Sheets

U.S. PATENT DOCUMENTS

| | | |
|---|---|---|
| 5,261,961 A | 11/1993 | Takasu et al. |
| 5,270,241 A | 12/1993 | Dennison et al. |
| 5,312,783 A | 5/1994 | Takasaki et al. |
| 5,392,189 A | 2/1995 | Fazan et al. |
| 5,395,771 A | 3/1995 | Nakato |
| 5,459,635 A | 10/1995 | Tomozawa et al. |
| 5,468,687 A | 11/1995 | Carl et al. |
| 5,470,398 A | 11/1995 | Shibuya et al. |
| 5,525,156 A | 6/1996 | Manada et al. |
| 5,596,214 A | 1/1997 | Endo |
| 5,614,018 A | 3/1997 | Azuma |
| 5,618,761 A | 4/1997 | Eguchi et al. |
| 5,635,741 A | 6/1997 | Tsu et al. |
| 5,656,329 A | 8/1997 | Hampden-Smith |
| 5,663,089 A | 9/1997 | Tomozawa et al. |
| 5,702,562 A | 12/1997 | Wakahara |
| 5,711,816 A | 1/1998 | Kirlin et al. |
| 5,719,417 A | 2/1998 | Roeder et al. |
| 5,723,361 A | 3/1998 | Azuma et al. |
| 5,731,948 A | 3/1998 | Yializis et al. |
| 5,736,759 A | 4/1998 | Haushalter |
| 5,776,254 A | 7/1998 | Yuuki et al. |
| 5,783,253 A | 7/1998 | Roh |
| 5,798,903 A | 8/1998 | Dhote et al. |
| 5,834,060 A | 11/1998 | Kawahara et al. |
| 5,909,043 A | 6/1999 | Summerfelt |
| 5,972,430 A | 10/1999 | DiMeo, Jr. et al. |
| 5,976,990 A | 11/1999 | Mercaldi et al. |
| 5,989,927 A | 11/1999 | Yamanobe |
| 6,025,222 A | 2/2000 | Kimura et al. |
| 6,037,205 A | 3/2000 | Huh et al. |
| 6,043,526 A | 3/2000 | Ochiai |
| 6,046,345 A | 4/2000 | Kadokura et al. |
| 6,078,492 A | 6/2000 | Huang et al. |
| 6,090,443 A | 7/2000 | Eastep |
| 6,101,085 A | 8/2000 | Kawahara et al. |
| 6,126,753 A | 10/2000 | Shinriki et al. |
| 6,127,218 A | 10/2000 | Kang |
| 6,143,679 A | 11/2000 | Nagasawa |
| 6,146,907 A | 11/2000 | Xiang et al. |
| 6,150,684 A | 11/2000 | Sone |
| 6,153,898 A | 11/2000 | Watanabe |
| 6,156,638 A | 12/2000 | Agarwal et al. |
| 6,165,834 A | 12/2000 | Agarwal et al. |
| 6,211,096 B1 | 4/2001 | Allman |
| 6,215,650 B1 | 4/2001 | Gnade et al. |
| 6,236,076 B1 | 5/2001 | Arita et al. |
| 6,238,734 B1 | 5/2001 | Senzaki et al. |
| 6,245,652 B1 | 6/2001 | Gardner et al. |
| 6,258,170 B1 | 7/2001 | Somekh |
| 6,258,654 B1 | 7/2001 | Gocho |
| 6,277,436 B1 | 8/2001 | Stauf et al. |
| 6,285,051 B1 | 9/2001 | Ueda et al. |
| 6,287,935 B1 | 9/2001 | Coursey |
| 6,323,057 B1 | 11/2001 | Sone |
| 6,325,017 B1 | 12/2001 | DeBoer et al. |
| 6,335,049 B1 | 1/2002 | Basceri |
| 6,335,302 B1 | 1/2002 | Satoh |
| 6,337,496 B2 | 1/2002 | Jung |
| 6,338,970 B1 | 1/2002 | Suh |
| 6,362,068 B1 | 3/2002 | Summerfelt |
| 6,372,686 B1 | 4/2002 | Golden |
| 6,422,281 B1 | 7/2002 | Ensign, Jr. et al. |
| 6,500,487 B1 | 12/2002 | Holst et al. |
| 6,507,060 B2 | 1/2003 | Ren et al. |
| 6,527,028 B2 | 3/2003 | Miller |
| 6,566,147 B2 | 5/2003 | Basceri et al. |
| 6,602,376 B1 | 8/2003 | Bradshaw |
| 2002/0197793 A1 | 12/2002 | Domfest et al. |
| 2003/0017266 A1 | 1/2003 | Basceri et al. |
| 2003/0045006 A1 | 3/2003 | Basceri |

FOREIGN PATENT DOCUMENTS

| | | |
|---|---|---|
| EP | 0 388 957 A2 | 9/1990 |
| EP | 0 474 140 A1 | 8/1991 |
| EP | 00 474 140 A1 | 8/1991 |
| EP | 0 835 950 A1 | 10/1997 |
| EP | 0 810 666 A1 | 12/1997 |
| EP | 0 855 735 A2 | 7/1998 |
| EP | 0 892 426 A2 | 1/1999 |
| EP | 0 957 522 A2 | 11/1999 |
| GB | 2 194 555 A | 3/1988 |
| JP | 2250970 | 10/1990 |
| JP | 04-024922 | 1/1992 |
| JP | 04-115533 | 4/1992 |
| JP | 04-180566 | 6/1992 |
| JP | 08-060347 | 3/1996 |
| JP | 2000091333 A | 3/2000 |
| WO | 98/39497 | 9/1998 |
| WO | 99/64645 | 12/1999 |
| WO | WO 01/16395 A1 | 3/2001 |

OTHER PUBLICATIONS

Streiffer et al., *Ferroelectricity in thin films: The dielectric response of fiber-textured $(Ba_xSr_{1-x})$ $Ti_{1+y}O_{3+2}$ thin films grown by chemical vapor deposition*, 86 J. Appl. Phys. No. 8, pp. 4565-4575 (Oct. 15, 1999).

Aoyama et al., *Leakage Current Mechanism of Amorphous and Polycrystalline $Ta_2O_5$ Films Grown by Chemical Vapor Deposition*, 143 J. Electrochem Soc., No. 3, pp 977-983 (Mar. 1996).

Valiev et al., *Plastic deformation of alloys with submircon-grained structure*Materials Science and Engineering, A137, pp. 35-40 (1991).

Tomoko Tsuyama Arai et al., *Preparation of $SrTiO_3$ Films on 8-Inch Wafers by Chemical Vapor Deposition*, Jpn. J. Appl. Phys., vol. 35 (1996) pp. 4875-4879.

DISSERTATION: Cem Basceri, *Electrical and Dielectric Properties of (Ba, Sr) $TiO_3$ Thin Film Capacitors for Ultra-High Density Dynamic Random Acess Memories*, Dept. of Mat, Sci. & Eng., NC State Univ. (1997).

Cem Basceri et al., *The dielectric response as a function of temperature and film thickness of fiber-textured (Ba, Sr)$TiO_3$ thin films grown by chemical . . .*, J. Appl. Phys., vol. 82, No. 5 (Sep. 1, 1997) pp. 2497-2504.

PRESENTATION: Steve Bilodeau et al., *Composition Dependence of the Dielectric Properties of MOCVD $Ba_xSr_{1-x}TiO_3$*, MRS Fall Meeting, Advanced Technology Materials (Dec. 1, 1994) pp. 1-21.

Steven M. Bilodeau et al., *MOCVD BST for High Density DRAM Applications*, CVD Technologies for Inter-Level Dielectrics and Interconnects Symposium, SEMICON/WEST (Jul. 12, 1995) 2 pages.

ABSTRACT: Y.C. Choi et al., *Improvements of the Properties of Chemical-Vapor-Deposited (Ba, Sr) TiO3 Films Through Use of a Seed Layer*, Jpn. J. Appl. Phys., vol. 1, Pt. 1 No. 11 (1997) pp. 6824-6828.

ABSTRACT: Chung Ming Chu et al., *Electrical Properties and crystal structure of (Ba, Sr)TiO/sub3/films Prepared at low temperature on a . . .*, Applied Physics Letters, vol. 70, No. 2 (1997) pp. 249-251.

ABSTRACT: Kazuhiro Eguchi et al., *Chemical vapor deposition of (Ba,Sr)TiO//3 thin films for application in a gigabit scale dynamic . . .*, Integrated Ferroelectrics, vol. 14, Nos. 1-4, Pt. 1 (1997) pp. 33-42.

ABSTRACT: Q. X. Jia et al., *Structural and dielectric properties of Ba/sub 0.5/Sr/sub 0.5/TiO/sub 3/ thin films with an epi-RuO/sub 2/ bottom electrode*, Integrated Ferroelectrics, vol. 19, Nos. 1-4 (1998) pp. 111-119.

Takaaki Kawahara et al., *(Ba, Sr)TiO₃ Films Prepared by Liquid Source Chemical Vapor Deposition on Ru Electrodes*, Jpn. J. Appl. Phys., vol. 35, Pt. 1, No. 9B (1996) p. 4880-4883.

Rajesh Khamankar et al., *A Novel Low-Temperature Process for High Dielectric Constant BST Thin Films for ULSI DRAM Applications*, Microelectronic Res. Center, Univ. of TX at Austin, TX (Undated) 2 pages.

ABSTRACT: Yong Tae Kim et al., *Advantages of RuO/sub x/ bottom electrode in the dielectric and leakage characteristics of . . .*, Jpn. J. Appl. Phys., vol. 35, Pt. 1, No. 12A (1996) pp. 6153-6156.

T. W. Kim et al., *Structural and electrical properties of BaTiO₃ grown on p-ImP (100) bby low-pressure metal-organic chemical vapor deposition . . .*, Appl. Phys. Lett., vol. 65, No. 15 (Oct. 10, 1994) pp. 1955-1957.

ABSTRACT: S. H. Paek et al., *Characterization of MIS capacitor of BST thin films deposited on Si by Rf magnetron . . .*, Ferroelectric Thin Films V. Symposium, San Francisco, CA (Apr. 7, 1995) pp. 33-38.

ABSTRACT: N. Takeuchi et al., *Effect of firing atmosphere on the cubic-hexabonal transition in Ba /sub 0.99/Sr sub . . .* , Nippon Seramikikusu Kyokai Gakujutsu Ronbunshi, vol. 98, No. 8 (1990) pp. 836-839.

ABSTRACT: H. Yamaguchi et al., *Reactive coevaporation synthesis and characterization of SrTiO/sub 3/ . . .* IEEE Internat'l Symposium on Applications of Ferroelectrics, Greenville, SC (Aug. 2, 1992) pp. 285-288.

ABSTRACT: Shintaro Yamamichi et al., *(Ba+Sr)/Ti ratio dependence of the dielectric properties for (Ba SUB 0 Sub. Sub 5 Sr Sub 0 Sub . Sub 5)TiO . . .*, Appl. Phys. Lett., vol. 64, No. 13 (1994) pp. 1644-1646.

ABSTRACT: M. Yamamuka et al., *Thermal-Desorption Spectroscopy of (Ba, Sr)TiO3 Thin-Films Prepared by Chemical-Vapor-Depsoition*, Jpn. J. of Appl. Phys., vol. 35, Pt. 1, No. 2A (1996) pp. 729-735.

U.S. Appl. No. 09/388,063, filed Aug. 1999, Agarwal et al.
U.S. Appl. No. 09/580,733, filed May 2000, Basceri.
U.S. Appl. No. 09/652,907, filed Aug. 2000, Basceri et al.
U.S. Appl. No. 09/776,217, filed Feb. 2001, Basceri.
U.S. Appl. No. 09/905,286, filed Jul. 2000, Basceri et al.

CHEMICAL VAPOR DEPOSITION METHODS OF FORMING BARIUM STRONTIUM TITANATE COMPRISING DIELECTRIC LAYERS, INCLUDING SUCH LAYERS HAVING A VARIED CONCENTRATION OF BARIUM AND STRONTIUM WITHIN THE LAYER

RELATED PATENT DATA

This patent resulted from a continuation application of U.S. patent application Ser. No. 09/905,320, filed Jul. 13, 2001, entitled "Chemical Vapor Deposition Methods of Forming Barium Strontium Titanate Comprising Dielectric Layers, Including Such Layers Having a Varied Concentration of Barium and Strontium Within the Layer", naming Cem Basceri and Nancy Alzola as inventor, the disclosure of which is incorporated by reference.

TECHNICAL FIELD

This invention relates to chemical vapor deposition methods of forming barium strontium titanate comprising dielectric layers, including such layers having varied concentration of barium and strontium within the layer.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials (such as ferroelectric materials, perovskite materials and pentoxides) are commonly referred to as "high k" materials due to their high dielectric constants, which make them attractive as dielectric materials in capacitors, for example for high density DRAMs and non-volatile memories. Using such materials enables the creation of much smaller and simpler capacitor structures for a given stored charge requirement, enabling the packing density dictated by future circuit design. One such known material is barium strontium titanate.

SUMMARY

The invention comprises in one aspect a chemical vapor deposition method of forming a barium strontium titanate comprising dielectric layer. A substrate is positioned within a chemical vapor deposition reactor. Barium and strontium are provided within the reactor by flowing at least one metal organic precursor to the reactor. Titanium is provided within the reactor. At least one oxidizer is flowed to the reactor. Conditions are provided within the reactor to be effective to deposit a barium strontium titanate comprising dielectric layer on the substrate from the reactants. The barium and strontium are provided within the reactor during all of the deposit of said layer at a substantially constant atomic ratio of barium to strontium. During the deposit a rate of flow of the oxidizer to the reactor is changed at least once to effect a change in relative atomic concentration of barium and strontium within the deposited barium strontium titanate comprising dielectric layer. In one aspect, during the deposit a rate of flow of the oxidizer to the reactor is changed at least once to effect a change in atomic concentration of titanium within the deposited barium strontium titanate comprising dielectric layer.

In other aspects, barium and strontium are provided within the reactor by flowing at least one metal organic precursor to the reactor. Titanium is provided within the reactor. Multiple oxidizers are flowed to the reactor. Conditions are provided within the reactor to be effective to deposit a barium strontium titanate comprising dielectric layer on the substrate from the reactants. In one embodiment, the oxidizers comprise at least $O_3$ and $N_2O$, with the $O_3$ being present within the reactor during at least a portion of the deposit at greater than 10% by volume of the total volume of $N_2O$ and $O_3$ within the reactor. In one embodiment, the oxidizers comprise at least $O_3$ and $NO_x$, where "x" is at least 1. In one embodiment, the oxidizers comprise at least $O_2$ and $NO_x$, where "x" is at least 1. In one embodiment, the oxidizers comprise at least $N_2O$ and $NO_x$, where "x" is at least 1.

Other embodiments are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The prior art recognizes the desirability in certain instances of fabricating barium strontium titanate dielectric regions of capacitors to have variable concentration at different elevational locations in the thickness of such regions of barium and strontium. The typical prior art method of providing variable stoichiometry of barium and strontium at selected locations within the thickness of a barium strontium titanate dielectric region is to vary the flows of the barium and strontium precursors to the reactor during a chemical vapor deposition (which may or may not be plasma enhanced). For example, increasing or decreasing the flow of the barium precursor or the strontium precursor will impact the atomic ratio of barium to strontium in the deposited barium strontium titanate layer. In some instances, separate barium and strontium precursors are mixed in the vapor phase, and the vapor mixture is flowed to the reactor.

Figure 1:
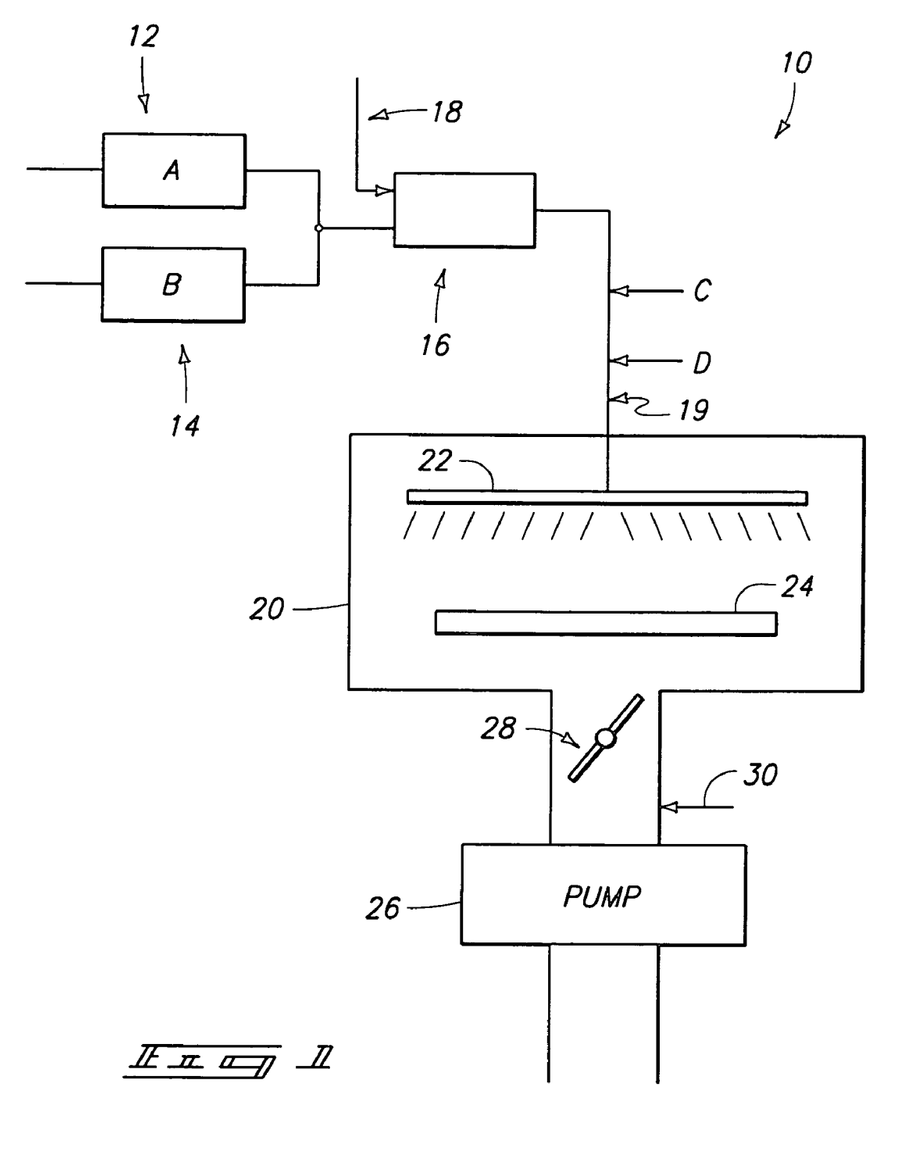
FIG. 1 is schematic diagram of an exemplary system usable in accordance with an aspect of the invention.

FIG. 1 diagrammatically illustrates but one chemical vapor deposition system 10 in accordance with but one implementation of a chemical vapor deposition method in accordance with an aspect of the invention. Such comprises an A precursor feed stream 12 and a B precursor feed stream 14. Such combine and feed to a vaporizer 16. An inert gas stream 18 can also be provided to vaporizer 16 to facilitate flow of the vaporized precursors to a downstream chamber.

A chemical vapor deposition chamber 20 is connected downstream of vaporizer 16. Such includes a showerhead 22 for receiving and distributing gaseous precursors therein. A suitable wafer holder 24 is received within chamber 20. Oxidizer gas feed streams, for example two oxidizer feed streams C and D, are preferably provided upstream of the showerhead. Further, an additional inert gas feed stream 19 is shown positioned between the oxidizer feed streams and chamber. More or less feed streams with or without mixing might also of course be utilized. The deposition is preferably conducted at subatmospheric pressure, with a vacuum pump 26 and an exemplary valve 28 being diagrammatically illustrated for achieving a desired vacuum pressure within chamber 20. Further, the deposition may or may not be plasma enhanced.

In one example, and by way of example only, the A stream consists essentially of a mixture of Ba and Sr precursors (i.e., preferably about 50%—50% by volume), and the B stream consists essentially of Ti precursor(s). Example preferred deposition is by metal organic chemical vapor deposition (MOCVD) processes, with at least one oxidizer being provided within chamber 20 with suitable MOCVD precursors to deposit a desired barium strontium titanate comprising dielectric layer. Example precursors, and by way of example only, include:

$Ba(thd)_2$—bis(tetramethylheptanedionate)
$Sr(thd)_2$—bis(tetramethylheptanedionate)
$Ti(thd)_2(O\text{-}i\text{-}Pr)_2$—(isopropoxide)bis(tetramethylheptanedionate)
$Ba(thd)_2$—bis(tetramethylheptanedionate)
$Sr(thd)_2$—bis(tetramethylheptanedionate)
$Ti(dmae)_4$—bis(dimethylaminoethoxide)
$Ba(methd)_2$—bis(methoxyethoxyte, hetramethylheptanedionate)
$Sr(methd)_2$—bis(methoxyethoxyte, tetramethylheptanedionate)
$Ti(mpd)(thd)_2$—bis(methylpentanediol, tetramethylheptanedionate)
$Ba(dpm)_2$—bis(dipivaloylmethanato)
$Sr(dpm)_2$—bis(dipivaloylmethanato)
$TiO(dpm)_2$—(titanyl)bis(dipivaloylmethanato)
$Ba(dpm)_2$—bis(dipivaloylmethanato)
$Sr(dpm)_2$—bis(dipivaloylmethanato)
$Ti(t\text{-}BuO)_2(dpm)_2$—(t-butoxy)bis(dipivaloylmethanato)
$Ba(dpm)_2$—bis(dipivaloylmethanato)
$Sr(dpm)_2$—bis(dipivaloylmethanato)
$Ti(OCH_3)_2(dpm)_2$—(methoxy)bis(dipivaloylmethanato)

Adducts (i.e., tetraglyme, trietherdiamine, pentamethyldiethlyenetriamine), solvents (i.e., butylacetate, methanol, tetrahydrofuran), and/or other materials might be utilized with the precursors. By way of example only, and where the precursors include metal organic precursors, example flow rates for the various of such precursors include anywhere from 10 mg/min. to 1000 mg/min. of liquid feed to any suitable vaporizer.

Figure 2:
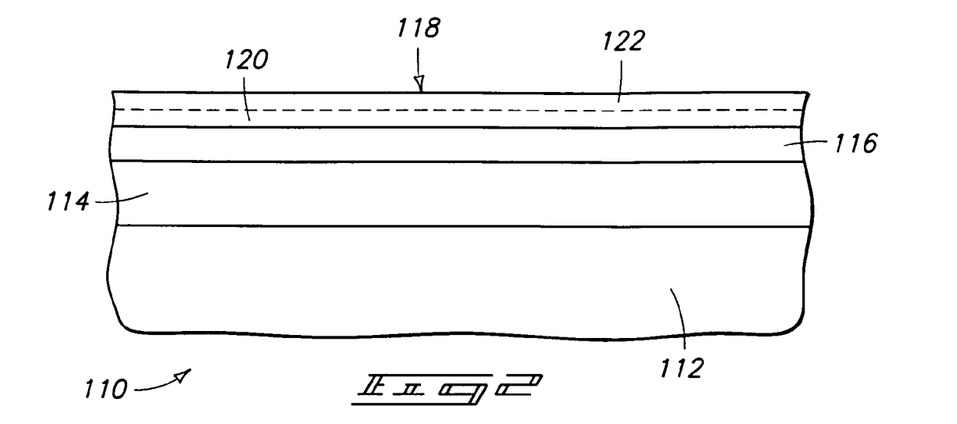
FIG. 2 a diagrammatic sectional view of a semiconductor wafer fragment in process in accordance with an aspect of the invention.

A first aspect of the invention is described in connection with a chemical vapor deposition method of forming a barium strontium titanate comprising dielectric layer. By way of example only, three exemplary implementations are described with reference to FIGS. 2–4. FIG. 2 depicts an exemplary substrate 110 comprising a bulk monocrystalline silicon substrate 112. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. An insulative layer 114, such as borophosphosilicate glass (BPSG) by way of example only, is formed over substrate 112. A conductive capacitor electrode layer 116, such as platinum or an alloy thereof by way of example only, is formed over layer 114.

Such substrate is placed within a chemical vapor deposition reactor. Plasma, remote or within the chamber, might be utilized. Barium and strontium are provided within the reactor by flowing at least one metal organic precursor to the reactor. Titanium is also provided within the reactor. By way of example only, exemplary precursors are as described above. At least one oxidizer is also flowed to the reactor. Conditions are provided within the reactor effective to deposit a barium strontium titanate comprising dielectric layer 118 on the substrate.

In accordance with but one aspect of the invention, the barium and strontium are provided within the reactor during all of the deposit of layer 118 at a substantially constant atomic ratio of barium to strontium. In the context of this document, a "substantially constant atomic ratio" of the barium and strontium in vapor phase within the reactor is to be interpreted as being from identically the same to within 5% atomic. In but one embodiment, during the deposit a rate of flow of the oxidizer is changed at least once to effect a change in relative atomic concentration of barium and strontium within the deposited barium strontium titanate comprising dielectric layer. Further in but one embodiment, during the deposit a rate of flow of the oxidizer to the reactor is changed at least once to effect a change in atomic concentration of titanium within the deposited barium strontium titanate comprising dielectric layer. Preferably in addition to providing a substantially constant atomic ratio of barium and strontium during all of the deposit, the barium and strontium are provided within the reactor during all of the deposit of the layer 118 at substantially constant volumetric flow rates to the reactor. In the context of this document, "substantially constant volumetric flow rates" are to be interpreted as being from exactly constant volumetric flow rates to within 5% volumetric.

In one preferred embodiment, the barium and strontium are provided within the reactor by flowing at least two metal organic precursors to the reactor, with one of the precursors comprising barium, and another of the precursors comprising strontium. Such precursors might be fed to the reactor as separate flow streams, or as a mixture in a single flow stream, as depicted by FIG. 1 and described above with respect to stream 12. Preferred oxidizers are inorganic.

Exemplary oxidizers include $NO_x$, where "x" is at least 1, $N_2O$, $O_2$, $O_3$, $H_2O$ and $H_2O_2$. An inert gas, for example Ar, might also be flowed to chamber 20 from feed line 19. In one aspect of the invention, at least two inorganic oxidizers are flowed to the reactor, such as various combinations of the above described oxidizers. In one aspect of the invention, the oxidizer comprises a single inorganic oxidizer consisting essentially of NO.

In the exemplary depicted FIG. 2 example, flow rate of the oxidizer(s) and flow rate of the metal organic precursor(s) are provided to the reactor under some suitable set of conditions effective to deposit a substantially homogenous first portion 120 of barium strontium titanate. Some aspect of the rate of flow of the oxidizer(s) (i.e., the rate of flow of one or more oxidizers to the reactor) is changed to affect a change in relative atomic concentration of barium and strontium, and/or titanium, for example to deposit a substantially homogenous second portion 122 of barium strontium titanate layer 118. Accordingly regions 120 and 122 of layer 18 while constituting barium strontium titanate have different relative atomic ratios of barium and strontium, and/or titanium. Ratios of barium to strontium in the deposited layer might vary anywhere from 1% to 99% barium versus strontium. Accordingly in one aspect of the invention, the processor is able to vary the barium and strontium ratio in a barium strontium titanate layer by varying flow of the oxidizer as opposed to varying one or more flows of the barium and strontium precursors.

For example in reduction to practice examples, increasing quantities of NO as an oxidizer was discovered to reduce barium incorporation in barium strontium titanate films using a substantially constant premixed 50%/50% by volume feed of barium and strontium precursors as described above. It was also discovered that increasing NO feed also increased deposition rate and reduced carbon incorporation in the deposited layer. Accordingly, barium to strontium ratio in a barium strontium titanate film can be modified without changing any aspect of the barium strontium precursor feeds.

Figure 3:
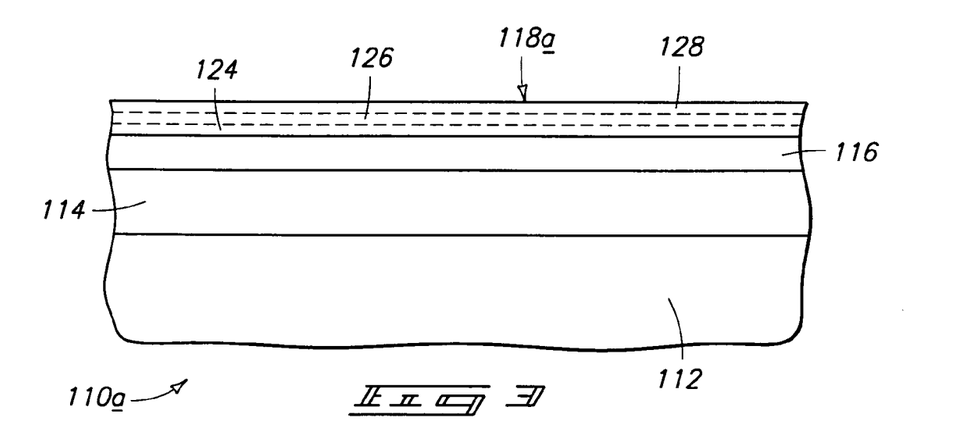
FIG. 3 is a diagrammatic sectional view of an alternate embodiment semiconductor wafer fragment in process in accordance with an aspect of the invention.

FIG. 3 illustrates an alternate embodiment wafer fragment 110a. Like numerals from the first described embodiment are utilized where appropriate, with differences being indicated with the suffix "a" or with different numerals. FIG. 3 depicts barium strontium titanate comprising dielectric layer 118a formed by oxidizer flow rate changes occurring in multiple discrete steps, thereby producing deposited layer 118a to have three portions 124, 126 and 128. Such portions are characterized by at least two different barium and strontium concentration regions. Accordingly, FIG. 3 depicts changing rate of flow of the oxidizer(s) at least twice. Accordingly by way of example only, region 124 and 128 may be of the same composition, with region 126 therebetween being different. Alternately by way of example only, all three regions might be different in barium strontium and/or titanium composition.

Figure 4:
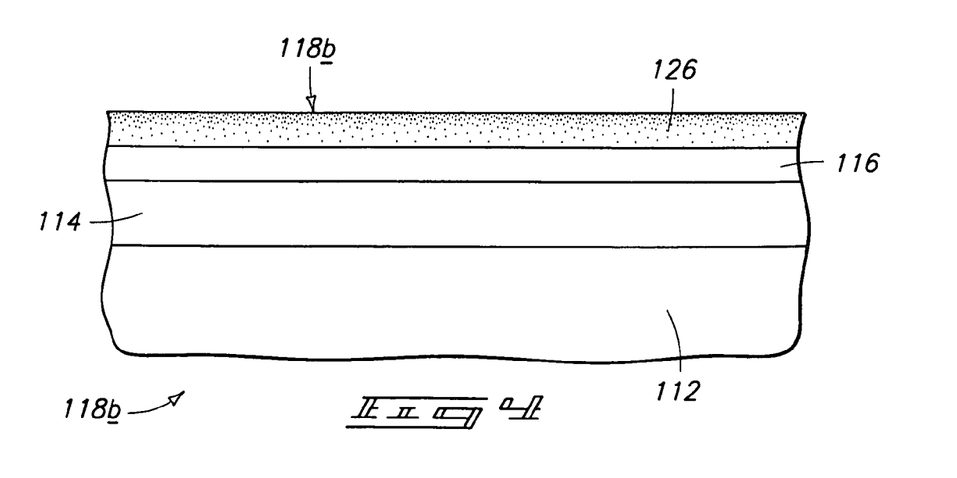
FIG. 4 is a diagrammatic sectional view of another alternate embodiment semiconductor wafer fragment in process in accordance with an aspect of the invention.

The invention also contemplates continuously varying of the oxidizer(s) flow effective to produce a gradient in barium-strontium, and/or titanium, concentration across at least some portion of the thickness of the deposited layer. An exemplary construction produced thereby is described with reference to FIG. 4 in connection with a substrate 110b. Like numerals from the first described embodiment are utilized where appropriate, with differences being indicated with the suffix "b" or with different numerals. Variable relative concentration of barium and strontium in the illustrated layer 118b is depicted by the increase in density across an increase in gradient from low to high of the illustrated dots or peppering of the illustrated layer 118b. FIG. 4 also illustrates the entirety of the thickness of layer 118b having been processed to produce variable barium and strontium concentration throughout the entirety of the layer. Alternately, only a majority or some smaller portion thereof might be produced to have a non-homogenous construction. Further, and by way of example only, any of the example FIG. 2 and FIG. 3 constructions might be processed to include some portion which includes a concentration gradient thereacross, as opposed to the specific embodiment described above with respect to homogeneity in the subject regions.

Other aspects of the invention are described below in connection with chemical vapor deposition methods of forming a barium strontium titanate comprising dielectric layer regardless of whether such has a varying concentration of barium and strontium within the layer, regardless of changing flow rate of an oxidizer, and regardless of whether a substantially constant atomic ratio of barium and strontium is provided in the reactor during deposit of the layer. In a first additional aspect of the invention, barium and strontium are provided within the reactor by flowing at least one metal organic precursor to the reactor, and flowing oxidizers comprising at least $O_3$ and $NO_x$ to the reactor, where "x" is at least 1. Conditions are maintained effective to deposit a barium strontium titanate comprising dielectric layer on the substrate from such precursor(s). Additional oxidizers, including additional inorganic oxidizers, can be flowed to the reactor during the deposit.

In another embodiment, the flowing oxidizers comprise at least $O_2$ and $NO_x$, where "x" is at least one.

In other embodiments, the flowing oxidizers comprise at least $N_2O$ and at least one of $NO_x$ and $O_3$, where "x" is at least one. Where $NO_x$ is utilized, it is ideally present within the reactor during at least a portion of the deposit at greater than 10% by volume of the total volume of $N_2O$ and $NO_x$ within the reactor. Where $O_3$ is utilized, it is ideally present within the reactor during at least a portion of the deposit at greater than 10% by volume of the total volume of $N_2O$ and $O_3$ within the reactor during the deposit. Additional oxidizers might also be utilized in combination with one or both of the $O_3$ and $NO_x$. By way of example, a combination of three oxidizers flowed to the reactor includes at least $O_2$, $O_3$ and $NO_x$. An alternate example includes $O_2$, $O_3$ and $N_2O$. Use of additional oxidizers is of also course contemplated.

Preferred total flows of the oxidizers include anywhere from 100 sccm to 4000 sccm, more preferably between 500 sccm and 2000 sccm, and more preferably between 750 sccm and 1250 sccm. Such flow rates and reduction to practice of the invention are with respect to an Applied Materials Centura Frame processor. A preferred pressure range is from 100 mTorr to 20 Torr, with a range of from 1 Torr to 6 Torr believed to be most preferred. Susceptor temperature is preferably from 100° C. to 700° C., more preferably from 400° C. to 700° C., with less than or equal to 550° C. being even more preferred, particularly in obtaining continuity in the deposited layer at a thickness at or below 200 Angstroms, and preferably at least down to 50 Angstroms. Most preferably, the susceptor temperature is kept at less than or equal to 550° C. during all of the deposit to form the subject layer. An inert gas, such as Ar, is also preferably flowed to the reactor downstream of the oxidizer feeds, and preferably at substantially the same flow rate as the total oxidizer flow rate.

The following effects are noted relative to oxide combinations. Such are provided by way of illustration only with respect to reduction to practice examples at 3 Torr, at a susceptor temperature of 500° C., and in an Applied Materials Centura reactor. Such are provided by way of illustration only, and in no way as limitations to be read into any of the accompanying claims. All comparisons below are with respect to a 50:50 volumetric ratio control feed of $O_2$ and $N_2O$ as the oxidizers.

Utilization of $O_2$ only tended to decrease the atomic percent concentration of titanium in the titanate, while deposition rate tended to increase. Using approximately 100% $O_3$ as the oxidizer tended to increase the atomic percent of titanium in the titanate, while reducing the deposition rate significantly. Utilization of $N_2O$ as a sole oxidizer also tended to increase the atomic percent of titanium in the titanate, and reduce the deposition rate significantly. Utilization of NO as the sole oxidizer tended to increase titanium concentration in the titanate but produced only about 5 atomic percent barium, 57 atomic percent strontium, and 38 atomic percent titanium as the metals in the titanate layer. Further, deposition rate was reduced significantly over the control.

Feeding a combination of $O_2$ and $O_3$ in a 1:1 volumetric ratio tended to decrease the titanium incorporation into the titanate, but increase the deposition rate. Using $O_2$ and $N_2O$ in combination in a 1:1 volumetric ratio tends to decrease titanium incorporation in the titanate, and increase the deposition rate. Utilization of $N_2O$ and $O_3$ in a 6:1 volumetric ratio also tended to increase the titanium incorporation in the titanate, but significantly reduced the deposition rate. Decreasing the deposition temperature (i.e., to below 600° C.) resulted in increased carbon content.

Utilization of a combination of NO and $O_2$ in a volumetric ratio of 1:1 increased titanium concentration significantly to 95%, and reduced strontium incorporation to about 1 atomic percent and barium incorporation to 4%. Deposition rate was also drastically reduced.

Utilization of NO and $O_3$ in a volumetric ratio of 1:1 increases titanium incorporation and also provided 17 atomic percent barium and 44 atomic percent strontium in the resultant titanate film. Deposition rate however was reduced over the control oxidizer mixture.

Deposition of barium strontium titanate films in the presence of an $O_3$ (93% $O_2$, 7% $O_3$) and Ar mixture caused the film composition to be somewhat self-adjusted. In other words, process conditions do not show a strong influence on film composition even when using different precursor flows for the barium, strontium and titanium. This is expected to result in a process of depositing barium strontium titanate of a given composition having a large process window. This should also facilitate formation of barium strontium titanate films over varying topography with negligible variation of stoichiometry over the sidewalls.

General observations were that $O_2$ as an oxidizer tends to decrease atomic percent titanium yet increases the deposition rate by almost double that of $O_3$, NO, $N_2O$. $O_3$ and $N_2O$ as individual oxidizers appear to have similar deposition rate and similar composition in the system analyzed. They both increase atomic percent titanium in the titanate, and reduce the deposition rate significantly.

NO as a sole oxidizer apparently results in low incorporation of barium, with the film constituting mostly Sr and Ti as the metals. Accordingly, increasing concentrations of NO may result in very low barium incorporations in barium strontium titanate films. The deposition rate with NO alone is similar to that of $O_3$ and $N_2O$.

When $O_2$, $O_3$ and $N_2O$ are combined, the following were observed. The affect of $N_2O$ is insignificant in terms of composition or deposition rate, as the results were very similar to the $O_2$ and $O_3$ runs. $O_2$ appears to control the deposition rate, because the runs with $O_2$ have higher deposition rates. Use of $O_2$, $O_3$ and $N_2O$ appeared to have no significant impact on the barium to strontium ratio in the titanate film.

When $O_2$, $O_3$ and NO were combined, the following was observed. NO alone produced a film that had little atomic percent barium incorporation. While adding $O_3$ with NO, the ozone enabled more barium incorporation, but had little effect on titanium incorporation. $O_2$ and NO results are similar to $O_2$, $O_3$ and NO, with the film being approximately 95% titanium, with less than 1% strontium, and approximately 4% barium. This indicates that $O_2$ and NO together apparently deplete strontium incorporation. The use of $O_2$ appeared to control the deposition rate, because the runs with $O_2$ had higher deposition rates.

In one aspect of the invention, composition gradients across a barium strontium titanate film can be adjusted without changing the flow rates of the barium, strontium and titanium precursor sources. Other aspects of the invention include various recited combination of oxidizers as literally claimed independent of the barium, strontium and titanium precursor feeds.

Additional and/or alternate preferred processing can occur in accordance with any of our co-pending U.S. patent application Ser. No. 09/476,516, filed on Jan. 3, 2000, entitled "Chemical Vapor Deposition Methods Of Forming A High K Dielectric Layer And Methods Of Forming A Capacitor", listing Cem Basceri as inventor; U.S. patent application Ser. No. 09/580,733, filed on May 26, 2000, entitled "Chemical Vapor Deposition Methods And Physical Vapor Deposition Methods", listing Cem Basceri as inventor; and U.S. patent application Ser. No. 09/905,286, filed concurrently herewith, entitled "Chemical Vapor Deposition Methods Of Forming Barium Strontium Titanate Comprising Dielectric Layers", listing Cem Basceri and Nancy Alzola as inventors. Each of these is hereby fully incorporated by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical vapor deposition method of forming a barium strontium titanate-comprising dielectric layer having a varied concentration of barium and strontium within the layer, comprising:

providing barium and strontium to a substrate by flowing at least one metal organic precursor to the substrate, and providing titanium to the substrate, and flowing a constant composition oxidizer stream to the substrate, under conditions effective to deposit a barium strontium titanate-comprising dielectric layer on the substrate; the barium and strontium being provided to the substrate during all of the deposit of said layer at a substantially constant atomic ratio of barium to strontium; and during said deposit, changing a rate of flow of the constant composition oxidizer stream to the substrate at least once to effect a change in relative atomic concentration of barium to strontium within the deposited barium strontium titanate-comprising dielectric layer.

2. The method of claim 1 comprising changing the rate of flow at least twice.

3. The method of claim 1 comprising providing the barium and strontium to the substrate by flowing at least two metal organic precursors to the substrate, one of the precursors comprising barium, another of the precursors comprising strontium.

4. The method of claim 1 comprising providing the barium and strontium to the substrate by flowing at least two metal organic precursors to the substrate, one of the precursors comprising barium, another of the precursors comprising strontium, the one and the another precursors being fed to the substrate as a mixture from a single flow stream.

5. The method of claim 1 comprising providing the barium and strontium to the substrate during all of the deposit of said layer at substantially constant volumetric flow rates to the substrate.

6. The method of claim 1 wherein the oxidizer is inorganic.

7. The method of claim 1 wherein the oxidizer comprises $NO_x$, where "x" is at least 1.

8. The method of claim 1 wherein the oxidizer comprises NO.

9. The method of claim 1 wherein the constant composition oxidizer stream comprises multiple oxidizers.

10. A chemical vapor deposition method of forming a barium strontium titanate-comprising dielectric layer having a varied concentration of titanium within the layer, comprising:

provided barium and strontium to a substrate by flowing at least one metal organic precursor to the substrate, and providing titanium to the substrate, and flowing a constant composition oxidizer stream to the substrate, under conditions effective to deposit a barium strontium titanate-comprising dielectric layer on the substrate; the barium and strontium being provided to the substrate during all of the deposit of said layer at a substantially constant atomic ratio of barium to strontium; and during said deposit, changing a rate of flow of the constant composition oxidizer stream to the substrate at least once to effect a change in atomic concentration of titanium relative to barium and strontium within the deposited barium strontium titanate-comprising dielectric layer.

11. The method of claim 10 wherein the changing of a rate of flow of the oxidizer to the substrate at least once is also effective to effect a change in relative atomic concentration of barium to strontium within the deposited barium strontium titanate-comprising dielectric layer.

12. The method of claim 10 comprising changing the rate of flow at least twice.

13. The method of claim 10 wherein the oxidizer is inorganic.

14. The method of claim 10 wherein the oxidizer comprises $NO_x$, where "x" is at least 1.

15. The method of claim 10 wherein the oxidizer comprises NO.

16. A chemical vapor deposition method of forming a barium strontium titanate-comprising dielectric layer having a varied concentration of barium and strontium within the layer, comprising:

providing barium and strontium to the substrate by flowing at least one metal organic precursor to the substrate, and providing titanium to the substrate, and flowing only a single oxidizer to the substrate, under conditions effective to deposit a barium strontium titanate-comprising dielectric layer on the substrate; the barium and strontium being provided to the substrate during all of the deposit of said layer at a substantially constant atomic ratio of barium to strontium; and during said deposit, changing a rate of flow of the single oxidizer to the substrate at least once to effect a change in relative atomic concentration of barium to strontium within the deposited barium strontium titanate-comprising dielectric layer.

17. The method of claim 16 comprising changing the rate of flow at least twice.

18. The method of claim 16 comprising providing the barium and strontium to the substrate by flowing at least two metal organic precursors to the substrate, one of the precursors comprising barium, another of the precursors comprising strontium.

19. The method of claim 16 comprising providing the barium and strontium to the substrate by flowing at least two metal organic precursors to the substrate, one of the precursors comprising barium, another of the precursors comprising strontium, the one and the another precursors being fed to the substrate as a mixture from a single flow stream.

20. The method of claim 16 comprising providing the barium and strontium to the substrate during all of the deposit of said layer at substantially constant volumetric flow rates to the substrate.

21. The method of claim 16 wherein the oxidizer is inorganic.

22. The method of claim 16 wherein the oxidizer comprises $NO_x$, where "x" is at least 1.

23. The method of claim 16 wherein the oxidizer comprises NO.

24. A chemical vapor deposition method of forming a barium strontium titanate-comprising dielectric layer having a varied concentration of titanium within the layer, comprising:

providing barium and strontium to a substrate by flowing at least one metal organic precursor to the substrate, and providing titanium to the substrate, and flowing only a single oxidizer to the substrate, under conditions effective to deposit a barium strontium titanate-comprising dielectric layer on the substrate; the barium and strontium being provided to the substrate during all of the deposit of said layer at a substantially constant atomic ratio of barium to strontium; and during said deposit, changing a rate of flow of the single oxidizer to the substrate at least once to effect a change in atomic concentration of titanium relative to barium and strontium within the deposited barium strontium titanate-comprising dielectric layer.

25. The method of claim 24 wherein the changing of a rate of flow of the oxidizer to the substrate at least once is also effective to effect a change in relative atomic concentration of barium to strontium within the deposited barium strontium titanate-comprising dielectric layer.

26. The method of claim 24 comprising changing the rate of flow at least twice.

27. The method of claim 24 wherein the oxidizer is inorganic.

28. The method of claim 24 wherein the oxidizer comprises $NO_x$, where "x" is at least 1.

29. The method of claim 24 wherein the oxidizer comprises NO.

* * * * *

UNITED STATES PATENT AND TRADEMARK OFFICE
CERTIFICATE OF CORRECTION

PATENT NO. : 6,982,103 B2
APPLICATION NO. : 10/769149
DATED : January 30, 2004
INVENTOR(S) : Cem Basceri It is certified that error appears in the above-identified patent and that said Letters Patent is hereby corrected as shown below:

Title Page, Item (57) Abstract, line 1 –
    Replace "The invention a chemical vapor deposition method of"
    Insert --The invention includes a chemical vapor deposition method of--

Col. 6, line 44
    Replace "additional oxidizer is of also course contemplated."
    Insert --additional oxidizer is also of course contemplated.--

Signed and Sealed this

Third Day of April, 2007

JON W. DUDAS
*Director of the United States Patent and Trademark Office*

UNITED STATES PATENT AND TRADEMARK OFFICE
CERTIFICATE OF CORRECTION

PATENT NO. : 6,982,103 B2
APPLICATION NO. : 10/769149
DATED : January 3, 2006
INVENTOR(S) : Cem Basceri It is certified that error appears in the above-identified patent and that said Letters Patent is hereby corrected as shown below:

Title Page, Item (57) Abstract, line 1 –
    Replace "The invention a chemical vapor deposition method of"
    Insert --The invention includes a chemical vapor deposition method of--

Col. 6, line 44
    Replace "additional oxidizer is of also course contemplated."
    Insert --additional oxidizer is also of course contemplated.--

This certificate supersedes Certificate of Correction issued April 3, 2007.

Signed and Sealed this

Eighth Day of May, 2007

JON W. DUDAS
*Director of the United States Patent and Trademark Office*